United States Patent
Kamphuis et al.

(10) Patent No.: US 8,895,357 B2
(45) Date of Patent: Nov. 25, 2014

(54) INTEGRATED CIRCUIT AND METHOD OF MANUFACTURING THE SAME

(71) Applicant: NXP B.V., Eindhoven (NL)

(72) Inventors: Tonny Kamphuis, Lent (NL); Leonardus Antonius Elisabeth van Gemert, Nijmegen (NL); Caroline Catharina Maria Beelen-Hendrikx, Weert (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/857,091

(22) Filed: Apr. 4, 2013

(65) Prior Publication Data

US 2013/0264691 A1   Oct. 10, 2013

(30) Foreign Application Priority Data

Apr. 5, 2012 (EP) .................................. 12163407

(51) Int. Cl.
| | | |
|---|---|---|
| H01L 21/00 | (2006.01) |
| H01L 23/552 | (2006.01) |
| H01L 21/48 | (2006.01) |
| H01L 23/60 | (2006.01) |
| H01L 23/31 | (2006.01) |
| H01L 21/683 | (2006.01) |
| H01L 23/00 | (2006.01) |
| H01L 23/544 | (2006.01) |

(52) U.S. Cl.
CPC ..... *H01L 23/552* (2013.01); *H01L 2224/13644* (2013.01); *H01L 23/3185* (2013.01); *H01L 2224/131* (2013.01); *H01L 21/4814* (2013.01); *H01L 2224/05569* (2013.01); *H01L 2224/02377* (2013.01); *H01L 2224/05572* (2013.01); *H01L 2223/54486* (2013.01); *H01L 23/60* (2013.01); *H01L 21/6835* (2013.01); *H01L 2224/13647* (2013.01); *H01L 2224/0235* (2013.01); *H01L 2221/6834* (2013.01); *H01L 24/05* (2013.01); *H01L 2223/54433* (2013.01); *H01L 2224/05008* (2013.01); *H01L 23/544* (2013.01); *H01L 2224/02375* (2013.01)
USPC ........... 438/107; 438/108; 438/113; 438/226; 438/458; 438/464; 438/460; 257/659; 257/684; 257/725; 257/792; 257/787; 257/E23.114

(58) Field of Classification Search
USPC ......... 438/107, 108, 113, 226, 458, 464, 460; 257/659, 684, 725, 792, 787, 788, 257/E23.114
See application file for complete search history.

(56) References Cited

U.S. PATENT DOCUMENTS 4,514,586 A * 4/1985 Waggoner ..................... 174/386
8,097,943 B2 * 1/2012 Badakere et al. ............. 257/691
(Continued)

OTHER PUBLICATIONS

"JPCA Standard JPCA-EB01—2nd Edition Standard on Device Embedded Substrate—Terminology/Reliability/Design Guide", JPCA Standard, 51 pgs, retrieved from the internet at: listserv.ipc.org/.../wa.exe?...EMBEDDEDNET...Embedded)...Embed...(2009).

(Continued)

*Primary Examiner* — Matthew Reames
*Assistant Examiner* — Vincent Wall

(57) ABSTRACT

Presented is an integrated circuit packaged at the wafer level wafer (also referred to as a wafer level chip scale package, WLCSP), and a method of manufacturing the same. The WLCSP comprises a die having an electrically conductive redistribution layer, RDL, formed above the upper surface of the die, the RDL defining a signal routing circuit. The method comprises the steps of: depositing the electrically conductive RDL so as to form an electrically conductive ring surrounding the signal routing circuit; and coating the side and lower surfaces of the die with an electrically conductive shielding material.

9 Claims, 13 Drawing Sheets

(56) References Cited

U.S. PATENT DOCUMENTS

| | | |
|---|---|---|
| 2005/0161799 A1 | 7/2005 | Jobetto |
| 2007/0284755 A1 | 12/2007 | Nomoto et al. |
| 2008/0087987 A1 | 4/2008 | Wang et al. |
| 2009/0065906 A1* | 3/2009 | Tanida et al. ............... 257/621 |
| 2009/0166785 A1 | 7/2009 | Camacho et al. |
| 2009/0166811 A1 | 7/2009 | Fujii |
| 2010/0283129 A1 | 11/2010 | Tetani et al. |
| 2011/0304011 A1* | 12/2011 | Lee et al. ............... 257/531 |

OTHER PUBLICATIONS

"Stacking of Known Good Rebuilt Wafers without TSV Applications in Industrial Domains", Embedded Wafer Level Packaging Workshop, IMAPS—Minatec Crossroad Grenoble, 47 pgs (Jun. 24, 2010).

Extended European Search Report for Patent Appln. 12163407.5 (Jul. 5, 2012).

* cited by examiner

INTEGRATED CIRCUIT AND METHOD OF MANUFACTURING THE SAME

CROSS-REFERENCE TO RELATED APPLICATIONS

This application claims the priority under 35 U.S.C. §119 of European patent application no. 12163407.5, filed on Apr. 5, 2012, the contents of which are incorporated by reference herein.

This invention relates to the field of integrated circuit, and more particularly to packaging an integrated circuit at the wafer level.

An integrated circuit packaged at the wafer level is referred to as a Wafer Level Chip Scale Package (WLCSP). This differs from the traditional process of assembling individual units in packages after dicing them from a wafer. This WLCSP process is an extension of wafer Fab processes, where the device interconnects and protection are accomplished using the traditional fab processes and tools. In the final form, a WLCSP device is essentially a die with an array pattern of bumps or solder balls attached at an I/O pitch that is compatible with traditional circuit board assembly processes.

WLCSP can be considered as a chip-scale packaging (CSP) technology, since the resulting package is of the same size as the die.

WLCSP technology differs from other ball-grid array (BGA) and laminate-based CSPs in that no bond wires or interposer connections are required.

The key advantages of the WLCSP is the die to PCB inductance is minimized, reduced package size, and enhanced thermal conduction characteristics.

Critical components are required to meet Electromagnetic Compatibility (EMC) standards and/or be shielded from Electromagnetic interference (EMI) and Electrostatic Discharge (ESD). Typically this is done using metal caps that act as a Faraday Cage (i.e. a metallic enclosure that prevents the entry or escape of an electromagnetic field). However, the continual need to reduce the size of integrated circuit means that conventional shielding approaches (such as those employing metal caps) are not suitable.

It is known to employ die embedding for the purpose of EM shielding, which enables a critical device to be capped and reduces the required board area compared to conventional types of protection. However, this die embedding technique requires the wafers to be shipped to an external board manufacture, thus breaking the manufacturing flow.

According to an aspect of the invention there is provided a method of manufacturing a wafer level chip scale package, WLCSP, comprising a die having an electrically conductive redistribution layer, RDL, formed above the upper surface of the die, the RDL defining a signal routing circuit, wherein the method comprises the steps of: depositing the electrically conductive RDL so as to form an electrically conductive ring surrounding the signal routing circuit; and coating the side and lower surfaces of the die with an electrically conductive shielding material, wherein the electrically conductive shielding material contacts at least a portion of the periphery of the conductive ring.

Thus, there is proposed is a method of manufacture that provides EMI and/or ESD protection through the provision of conductive material around the die without a resultant size increase or the use of non-semiconductor processes. The costs of such a manufacturing process are typically lower than alternative methods that may require separate non-semiconductor processes.

According to another aspect of the invention there is provided a WLCSP comprising a die having an electrically conductive redistribution layer, RDL, formed above the upper surface of the die, the RDL defining a signal routing circuit, wherein the electrically conductive RDL forms an electrically conductive ring surrounding the signal routing circuit, and wherein the side and lower surfaces of the die are coated with an electrically conductive shielding material such that the electrically conductive shielding material contacts at least a portion of the periphery of the conductive ring Embodiments may employ electroless (E-less) plating after formation of the electrically conductive redistribution layer into an electrically conductive ring encircling a circuit of the die. This provides a contact ring around the die for connection of the ground plane (on top of die) to side and back-side plating of the die, thereby providing maximum EM shielding. Also, associated costs may be reduced, since existing E-less plating techniques and material may be used.

The corners of the die may also be e-less plated, due to the fact that the dies are completely separated, whereas conventional embedded approaches require the dies to be held together at the corners (therefore preventing plating of the die corners). Embodiments thus provide a shielding arrangement that covers the sides, corners, and backside of a WLCSP.

Further, the size of a WLCSP according to the invention may be nearly the same as a conventional non-shielded WLCSP. In other words, a WLCSP according to the invention may only be larger than a conventional WLCP by the thickness of the electrically conductive shielding material.

Examples of the invention will now be described in detail with reference to the accompanying drawings, in which.

Figure 1:
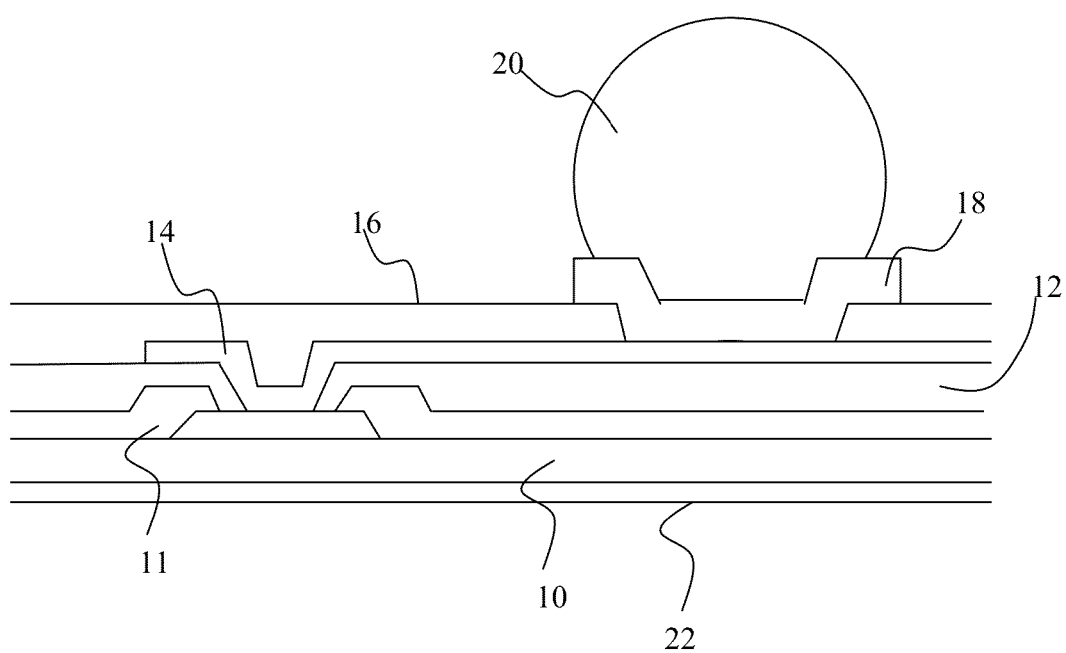
FIG. 1 is a cross-sectional representation of a conventional typical WLCSP.

A cross-sectional representation of a conventional typical WLCSP package with Redistribution Layer (RDL) and Under Bump Metallization (UBM) is shown in FIG. 1. Also, a flow diagram of a conventional WLCSP process for manufacturing the WLCSP package is shown in FIG. 2.

The WLCSP die 10 and passivation layer 11 is coated with a first layer of organic dielectric/polyimide 12 (Step 100). A metal redistribution layer (RDL) 14 for re-routing the signal path from the die peripheral I/O to a new desired location is then deposited on the first layer of organic dielectric 12 (Step 110). The RDL metal 14 is coated with a second dielectric/polyimide layer 16 so as to cover the RDL metal and then patterned into the solder ball array (Step 120). To prevent diffusion and enable solder wetting, an under-bump metallization (UBM) layer 18 is deposited on the RDL 14 (Step 130).

A solder ball 20 formed from a lead-free alloy is positioned to contact the UBM layer 18 (Step 140). A printed solder or plated or ball drop process can be used for solder bumps. For some applications, a Cu pillar bump, or an Au bump, instead of the solder bump can be employed. These are typically plated bumps. The lower side of the die 10 is coated with a protective polymer film 22 (Step 150). This polymer film 22 provides both a mechanical contact and UV light protection to the lower side of the die 10.

Figure 2:
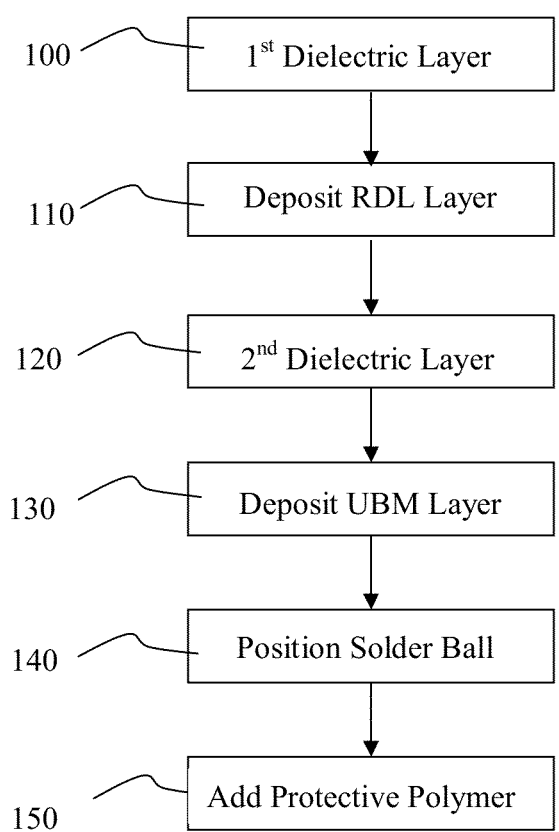
FIG. 2 is a flow diagram of a conventional WLCSP process for manufacturing the WLCSP package of FIG. 1.

It will be understood that the example of FIGS. 1 and 2 in the above paragraph demonstrates a WLCSP package formed using a two-layer RDL process, wherein the RDL metal layer 14 is between two polyimide layers 12 and 16.

Turning now to FIGS. 3 through 12, an embodiment of the invention will now be described.

Figure 3A:
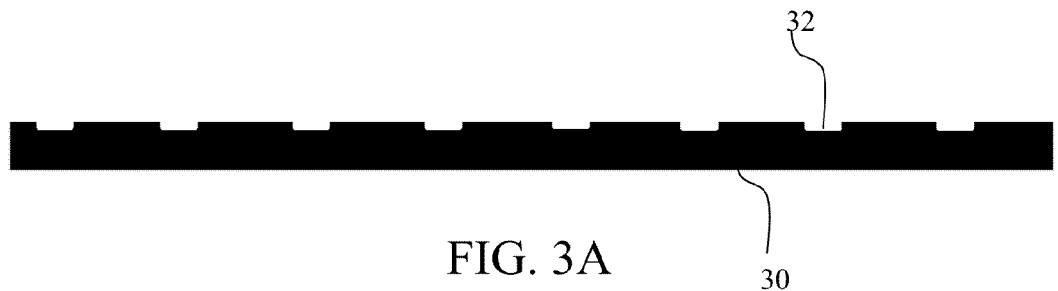
FIGS. 3-12 illustrate the steps of manufacturing a WLCSP according to an embodiment of the invention.
Figure 3B:
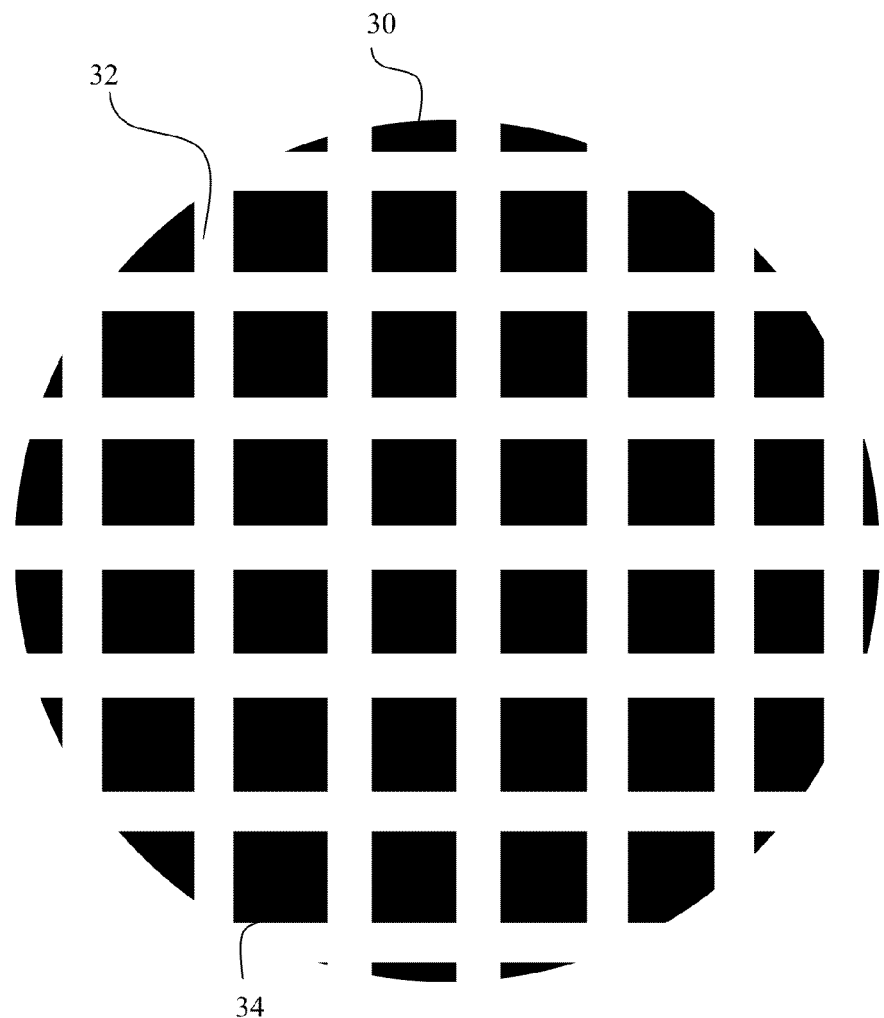

Firstly, as shown in FIGS. 3A and 3B, a conventional die wafer 30 is etched to create a grid pattern of trenches 32 in the die wafer 30. The trenches 32 are saw lanes for guiding sawing of the die wafer 30 into a plurality of individual dies 34 (later in the manufacturing process). Here, the trenches or saw lanes 32 are 5-20 µm deep and 44 µm wide, depending on the sawing lane width for example. It is noted that this may be preferable to ensure that there is no passivation over the etched saw lanes 32.

Figure 4A:
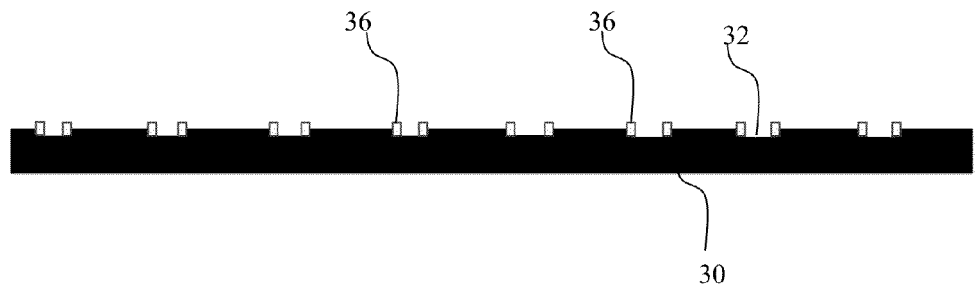
Figure 4B:
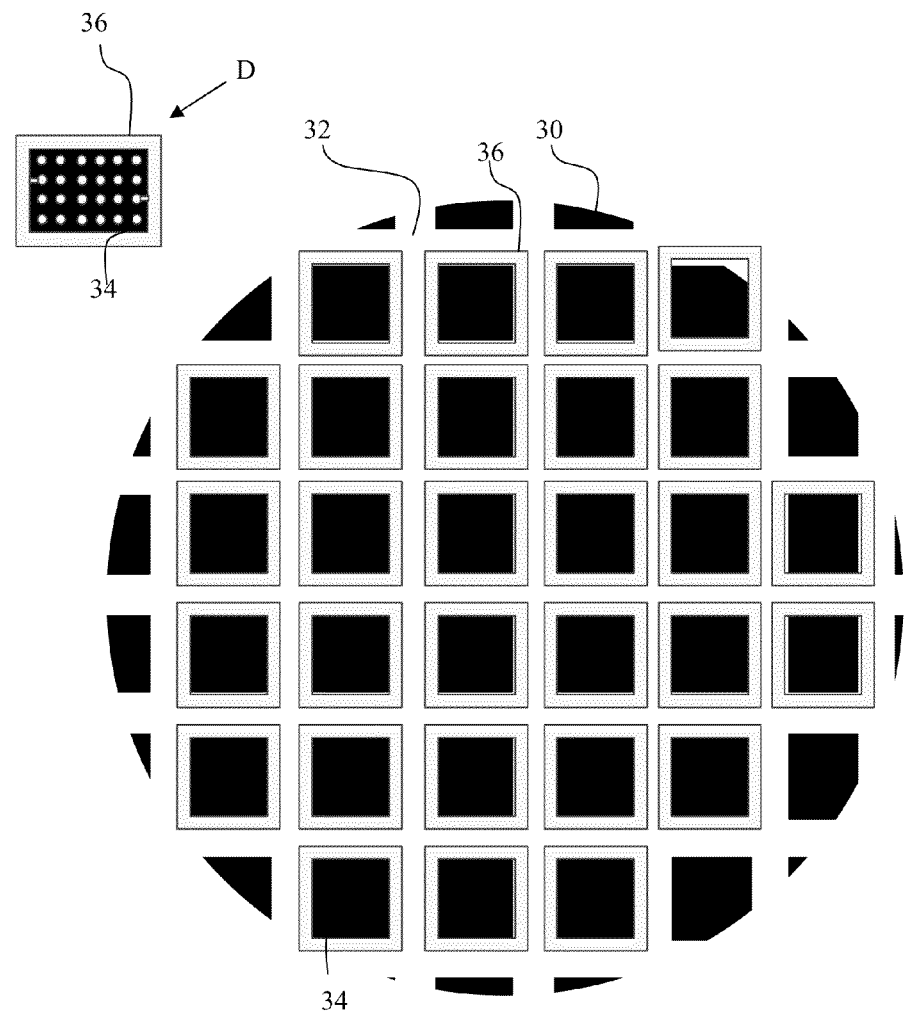

Next, as shown in FIGS. 4A and 4B, the top surface of the die 30 is prepared for reception of a metal RDL by forming ground pads 36 in the trenches 32 around each die 34, thereby forming a ground ring 36 around each die 34 (as shown by the illustration of an enlarged view of an individual die D on the die wafer in FIG. 4B). Here, the ground ring 36 is formed to be 10 µm wide.

Figure 5A:
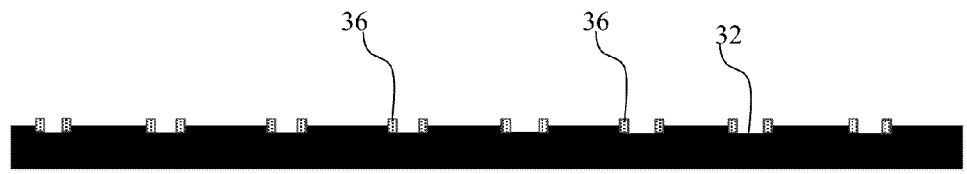
Figure 5B:
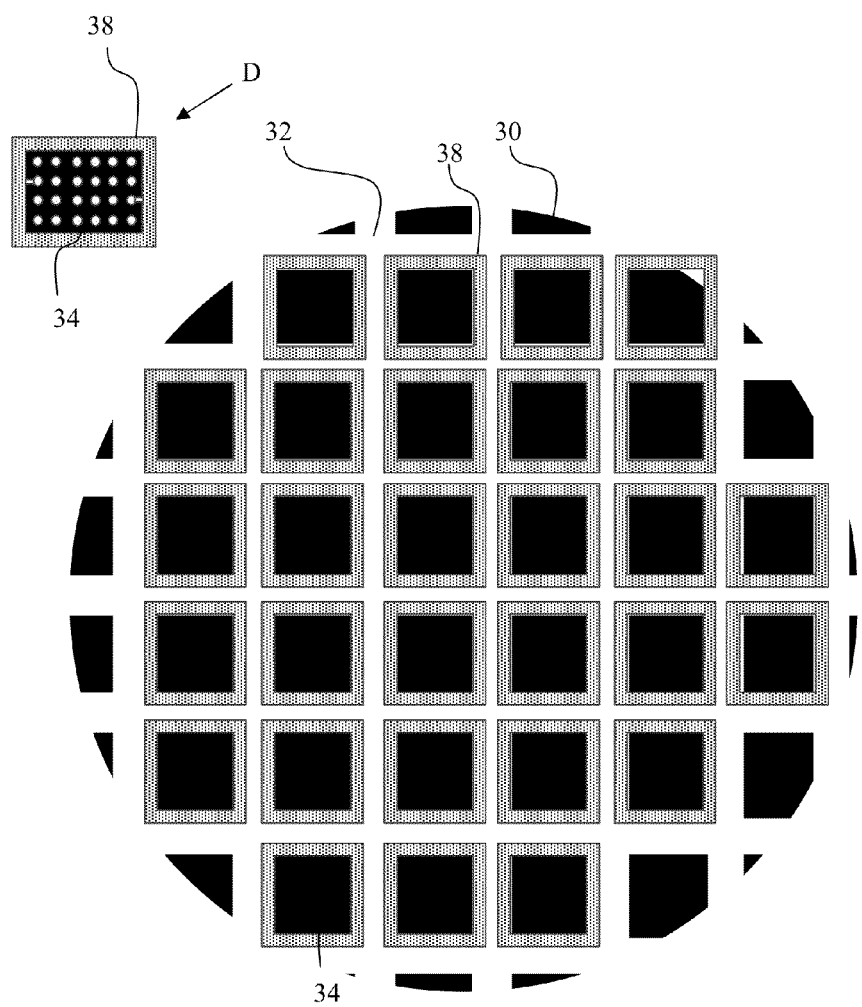

As shown in FIGS. 5A and 5B, the die wafer 30 is then plated with Copper (Cu) to form a Cu ring 38 around each die 34.

Figure 6A:
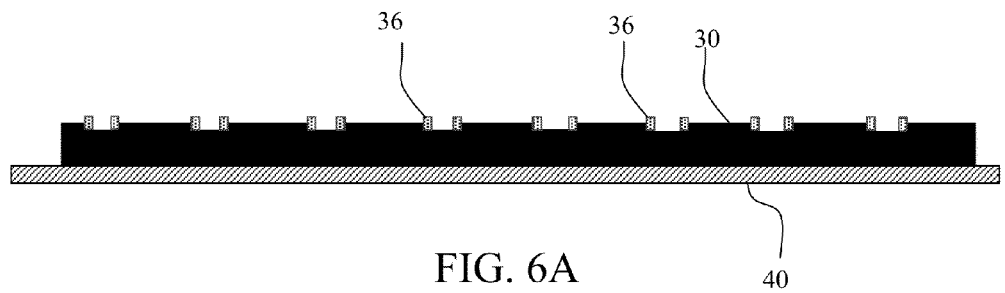
Figure 6B:
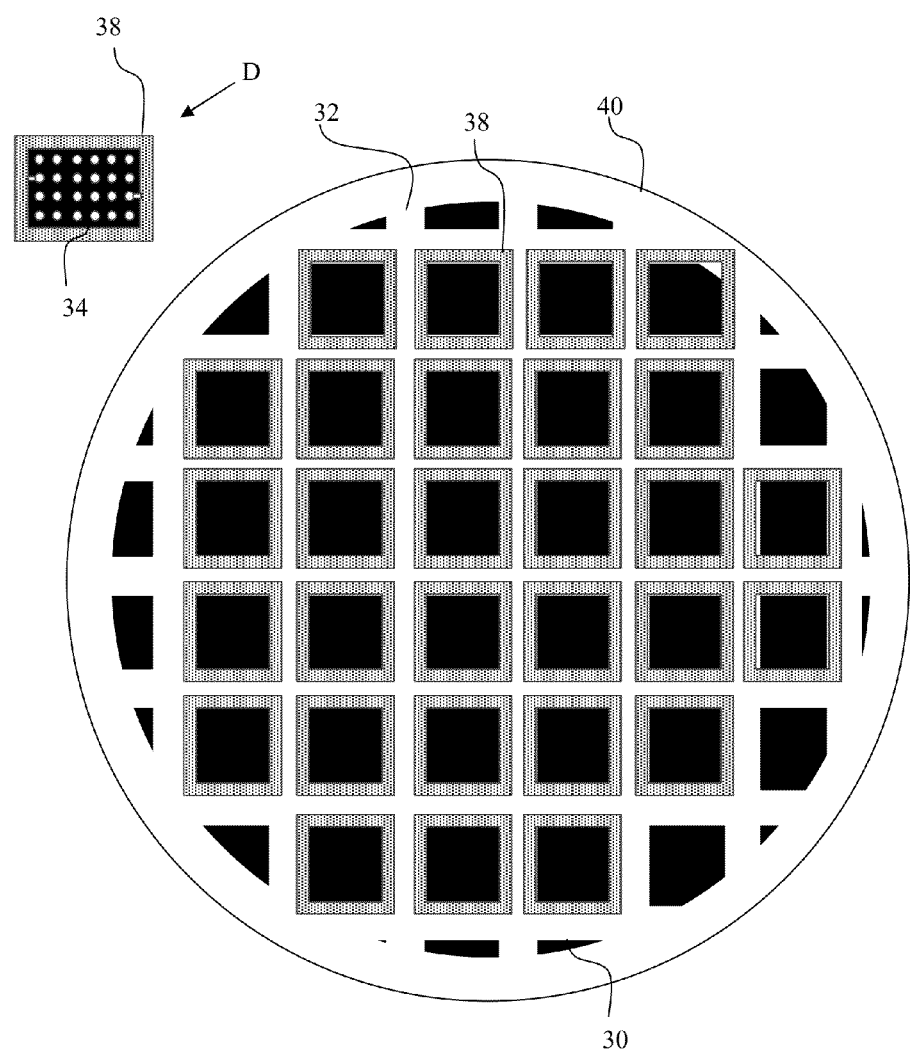
Figure 7A:
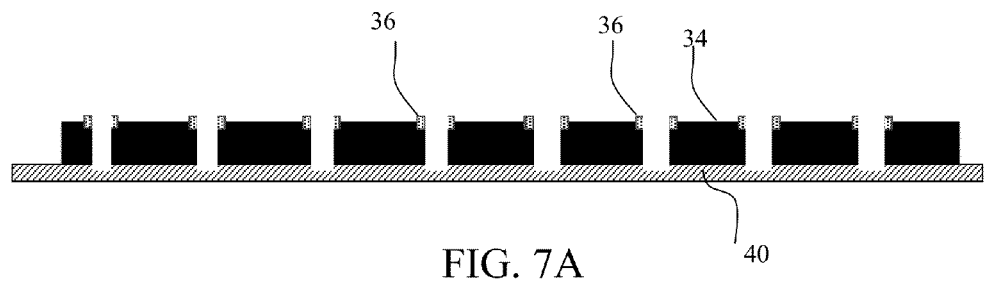
Figure 7B:
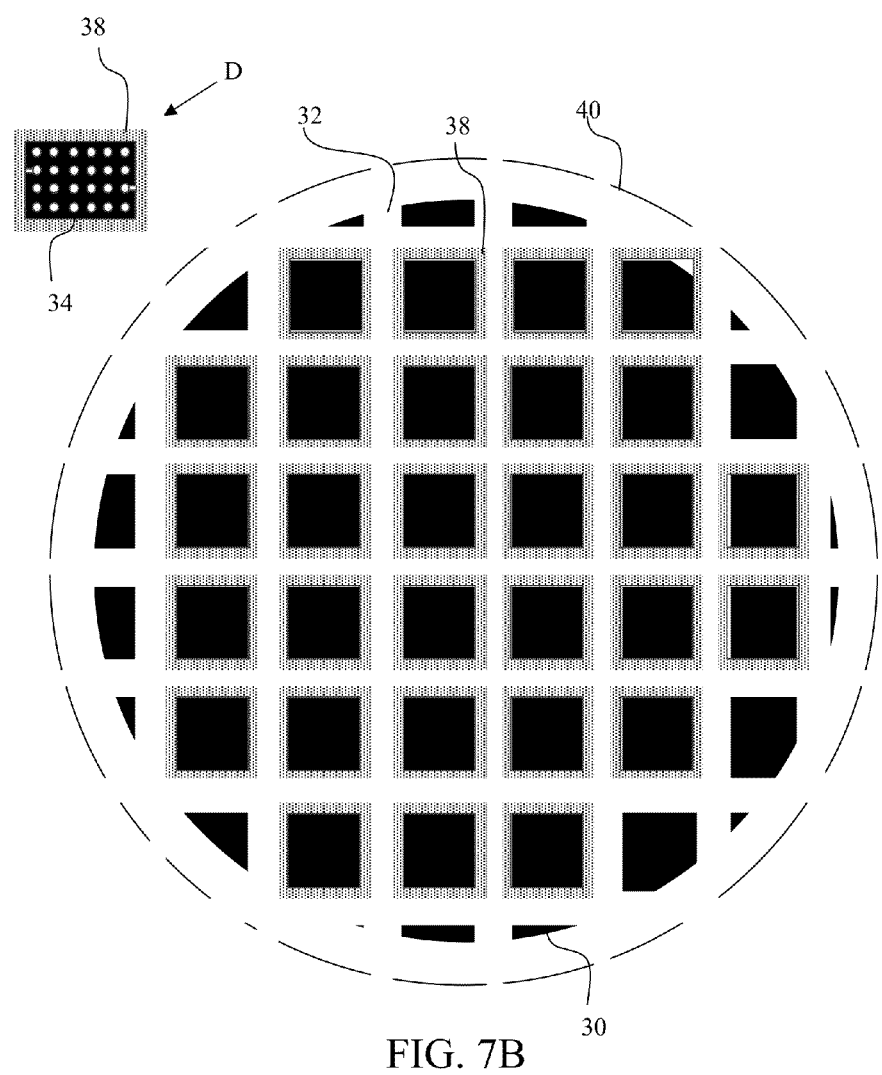

Turning to FIGS. 6A and 6B, the die wafer 30 is then mounted on sawing tape 40 and sawed along the saw lanes (i.e. trenches) 32 to create individual, separate dies 34 as shown in FIGS. 7A and 7B. Any suitable sawing method may be employed, such as one-cut sawing or step cut sawing for example. It is noted that, here, that the sawing process has been completed so that each saw has passed through the entire thickness (i.e. vertical extent) of the wafer 30 and into the sawing tape 40. Also, each saw is marginally thicker than the lateral separation between adjacent ground ring edges, thus meaning that the peripheral edges of the ground rings 36 are contacted by the saw when sawing the wafer. This is illustrated in FIG. 7B by the removal of the outline of the ground rings 36, indicating that the edges of the ground rings 36 have been removed by the sawing process. In other words, a ground ring 36 arranged around a die in the saw lane is touched by the sawing blade, thus resulting in removal of at least a portion of the periphery of the ground ring 36 during sawing. This may help to ensure that the E-less NiPdAu plating contacts the ground ring 36 when the sides of the die 34 are E-less plated (detailed below).

Figure 8:
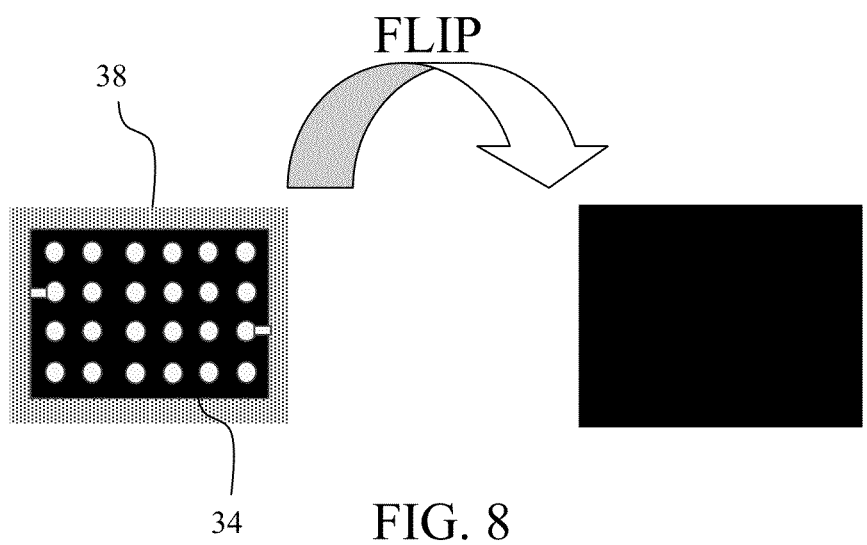
Figure 9A:
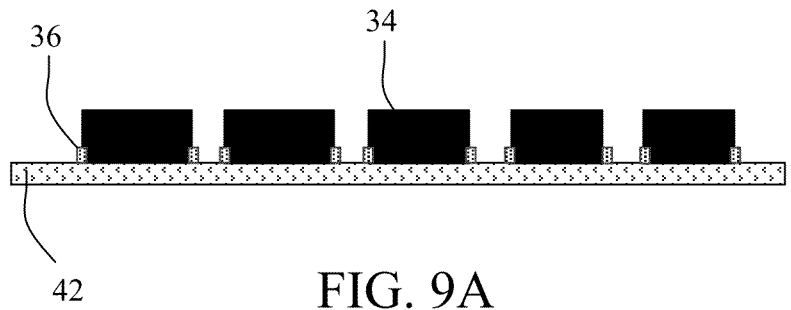
Figure 9B:
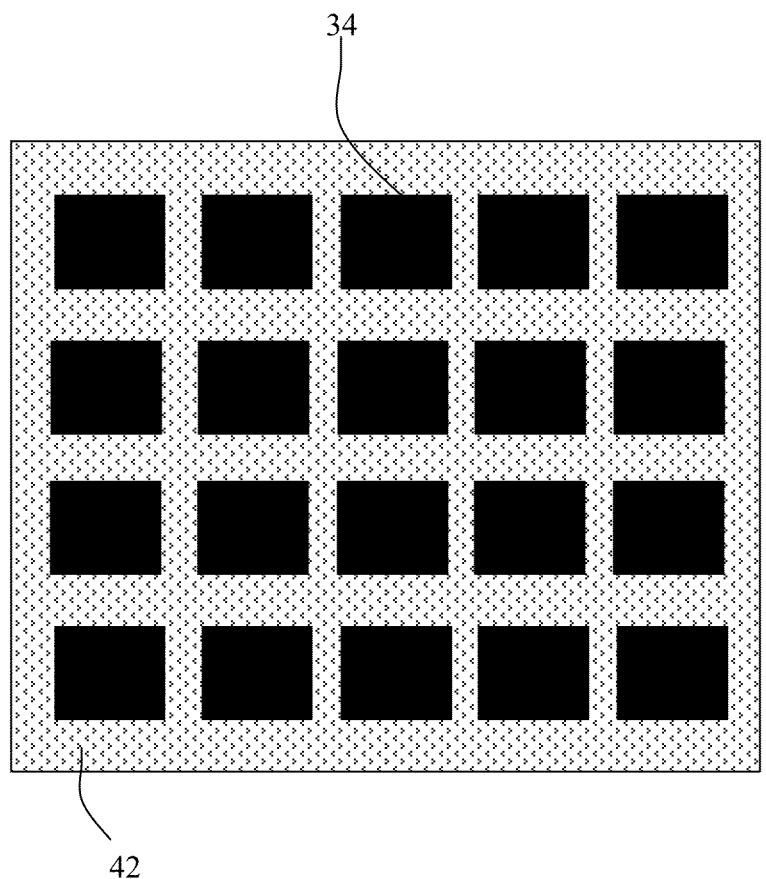
Figure 10A:
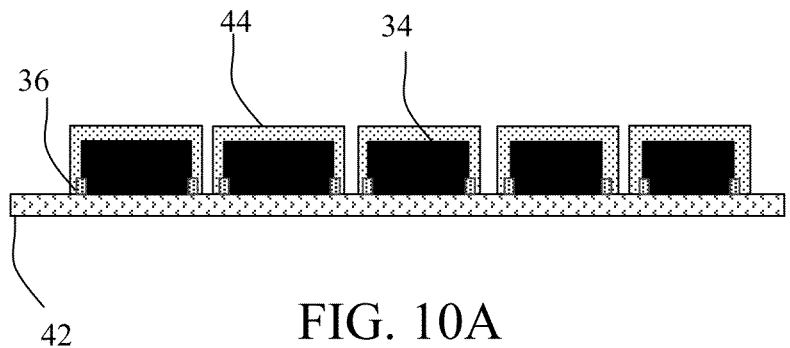
Figure 10B:
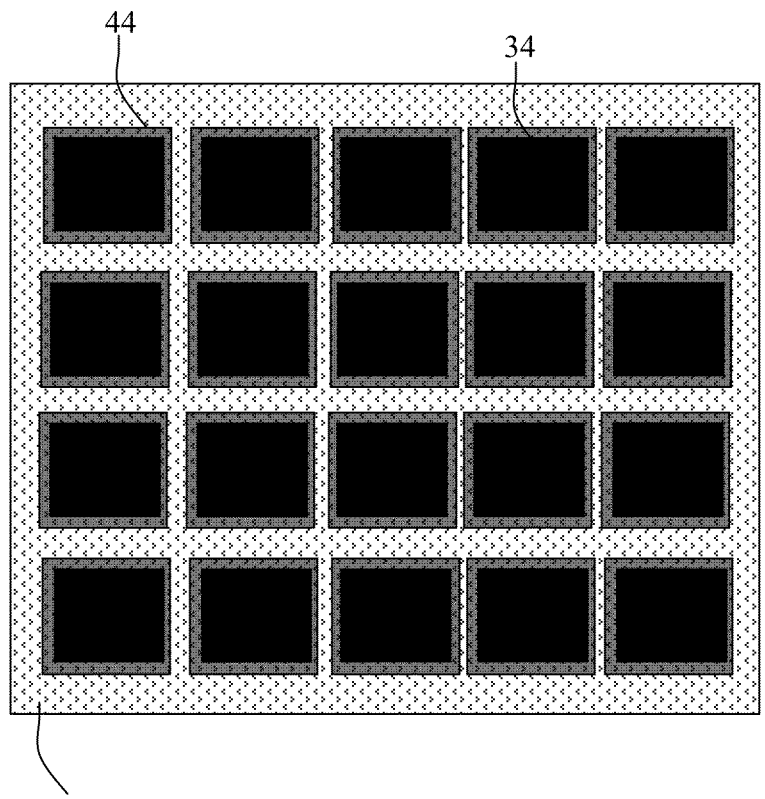
Figure 11A:
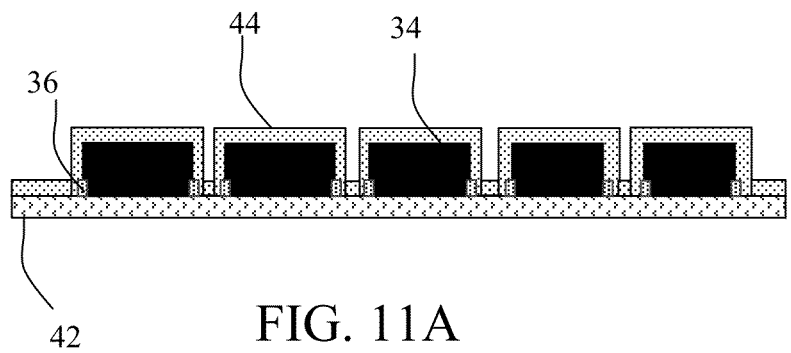
Figure 11B:
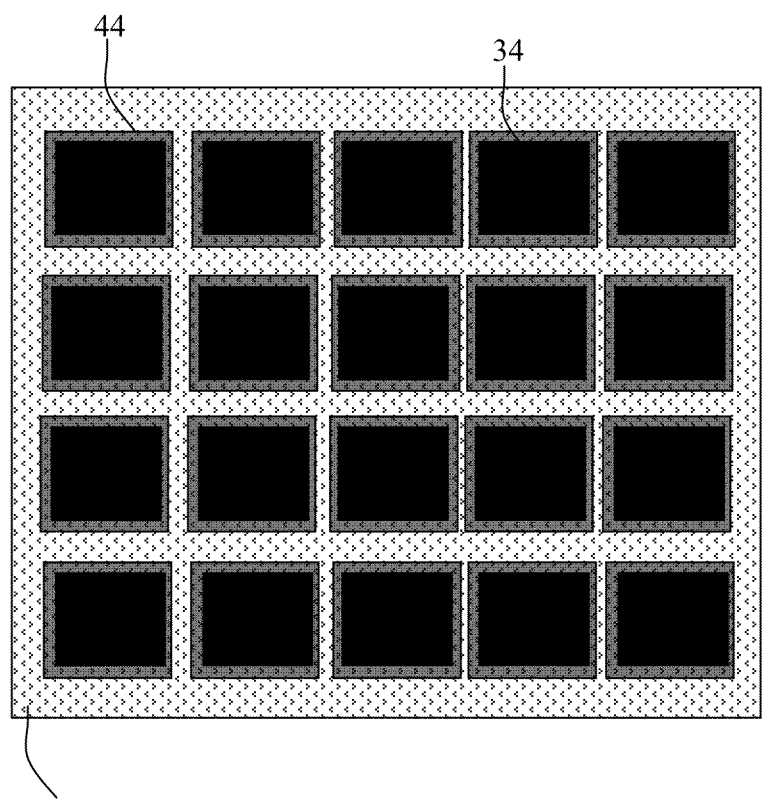

Next, the separated dies 34 are flipped over as shown in FIG. 8. Here, the dies are flipped on top of an UV/Heat-curable glue layer which is printed on a sheet of glass 42 or other suitable carrier for holding the dies during further processing. This enables the pitch (i.e. separation between die) to be increased. It also covers the front side (i.e. the originally upwardly facing side) of the dies, to avoid processing of the front side. In this way, a reconfigured wafer of dies 34 can be provided as shown in FIGS. 9A and 9B As shown in FIGS. 10A and 10B, E-less NiPdAu 44 is then plated (using an E-less plating process) on the side and back of the dies 34 (that are positioned on the sheet of glass 42). Here, the E-less metal overlaps the dies 34 so as to cover all sides of the dies (except that in contact with the glass 42). The now upwardly facing side of the dies 34 (i.e. the backside of a die 34 once flipped back, or the side of the die opposite to the side contacting the glass 42) are then marked using the laser-based or ink-jet printing process, so as to provided labelled dies 34 as shown in FIGS. 11A and 11B.

Figure 12A:
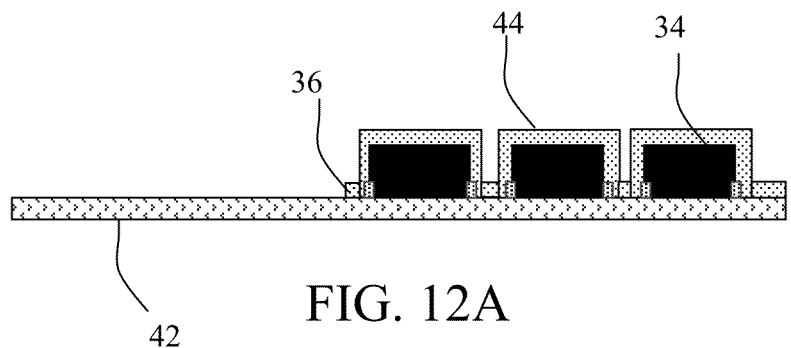
Figure 12B:
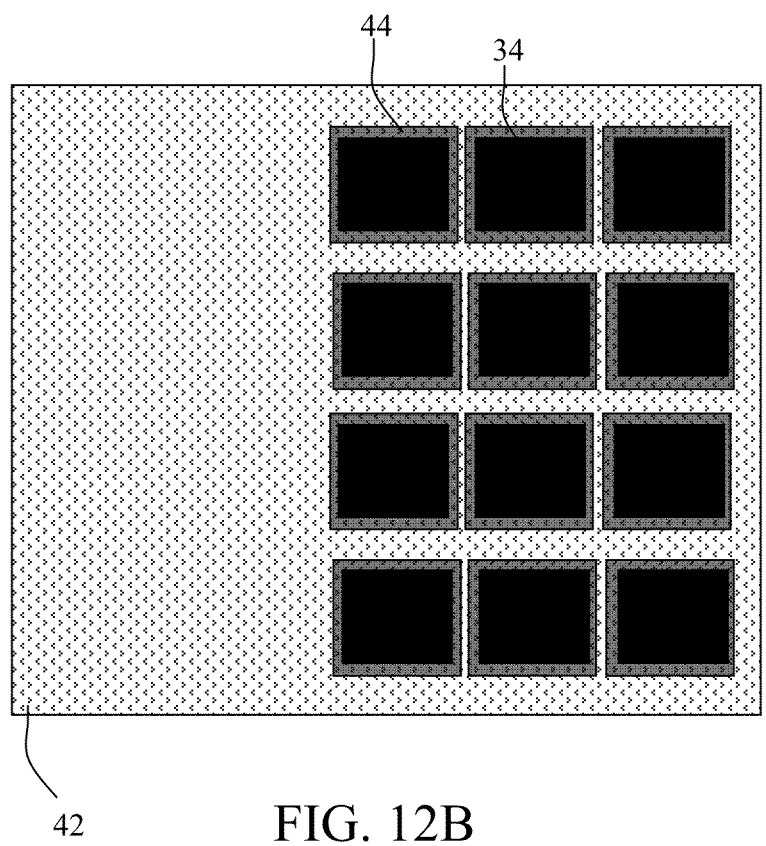

Finally, as shown in FIGS. 12a and 12B, the dies 34 are removed from the sheet of glass 42 and placed in Jedec tray for conventional testing and packing.

Figure 13:
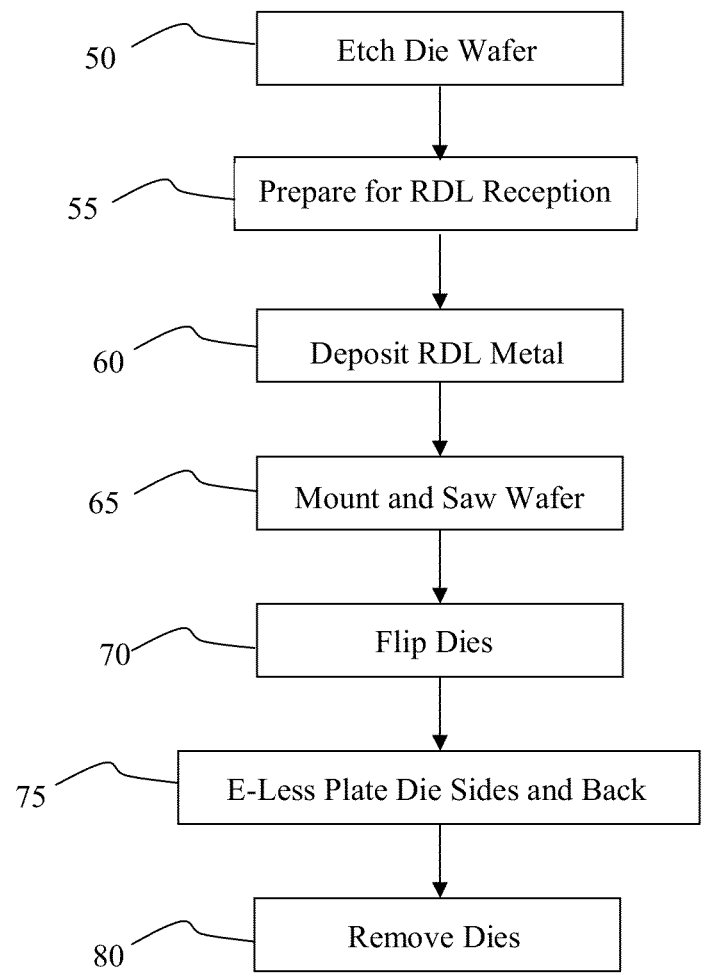
FIG. 13 is a flow diagram of a method of manufacturing a WLCSP according to an embodiment of the invention.

Turning to FIG. 13, there is shown a simplified flow diagram of a method of manufacturing a WLCSP according to an embodiment of the invention.

Firstly, in step 50, a die wafer is etched to create a grid pattern of trenches in the die wafer, the pattern of trenches separating individual dies on the wafer. Thus, the etched trenches act as guides for sawing of the die wafer into a plurality of individual dies. Next, in step 55, the upper surface of the die is prepared for reception of a metal RDL by forming ground pads in the trenches surrounding each die. The pads therefore form a ground ring encircling each die.

The metal for the RDL is then deposited on the ground pads in step 60. This results in the formation of an electrically conductive ring surrounding each die.

The die wafer is then mounted on sawing tape and sawn along each of the saw lanes to create individual, separate dies in step 65. Here, the sawing process is adapted to remove at least a portion of the peripheral edges of the electrically conductive rings. In other words, an electrically conductive ring is touched by the sawing blade, thus resulting in removal of at least a portion of the periphery of the ring during the sawing process. This may help to ensure that the electrically conductive ring extends to the edge of an individual die so that it can be contacted by material that is (later) plated on the sides of the die.

Next, the separated dies are flipped over in step 70, and then plated (using an E-less plating process) in step 75. The E-less metal plating is applied to the sides and back (i.e. the originally downwardly facing side which is now upwardly facing after flipping) of the dies so that it contacts at least a portion of the periphery of the conductive ring.

Finally, the dies are removed for testing and/or use in step 80.

Various modifications will be apparent to those skilled in the art. For example, the step of etching the die wafer to create sawing guides may be omitted in alternative embodiments. Also, other embodiments may comprise the additional steps of thinning and laser marking the wafer, as well as bumping on the top side of the wafer.

In yet further alternative embodiments, the full saw lane etches may be metal place, so that no individually separated rings are visible prior to sawing the die wafer.

Furthermore, coating the side and lower surfaces of the die with an electrically conductive shielding material can comprise the step of spraying metals to apply iso eless plating.

The invention claimed is:

1. A method of manufacturing a wafer level chip scale package, WLCSP, comprising a die having an electrically conductive redistribution layer, RDL, formed above the upper surface of the die, wherein the method comprises:
   depositing the electrically conductive RDL so as to define a signal routing circuit and form an electrically conductive ring surrounding the signal routing circuit;
   coating the side and lower surfaces of the die with an electrically conductive shielding material, wherein the electrically conductive shielding material contacts at least a portion of the periphery of the conductive ring; and
   wherein after depositing the electrically conductive RDL and prior to coating the side and lower surfaces of the die with an electrically conductive shielding material, removing at least a portion of the periphery of the conductive ring.

2. The method of claim 1, wherein coating the side and lower surfaces of the die with an electrically conductive shielding material comprises electroless plating the side and lower surfaces of the die with an electroless metal.

3. The method of claim 2, wherein the electroless metal is an electroless nickel.

4. The method of claim 2 further comprising, prior to coating the side and lower surface of the die with an electrically conductive shielding material, turning the die over so as to reverse the orientation of the upper and lower surfaces of the die.

5. The method of claim 1 further comprising, prior to coating the side and lower surface of the die with an electrically conductive shielding material, turning the die over so as to reverse the orientation of the upper and lower surfaces of the die.

6. A method of manufacturing a wafer level chip scale package, WLCSP, comprising a die having an electrically conductive redistribution layer, RDL, formed above the upper surface of the die, wherein the method comprises:

depositing the electrically conductive RDL so as to define a signal routing circuit and form an electrically conductive ring surrounding the signal routing circuit:

coating the side and lower surfaces of the die with an electrically conductive shielding material, wherein the electrically conductive shielding material contacts at least a portion of the periphery of the conductive and wherein prior to depositing the electrically conductive RDL, etching trenches in the die surrounding the signal routing circuit.

7. The method of claim 6, wherein coating the side and lower surfaces of the die with an electrically conductive shielding material comprises electroless plating the side and lower surfaces of the die with an electroless metal.

8. The method of claim 7, wherein the electroless metal is an electroless nickel.

9. The method of claim 6, further comprising , prior to coating the side and lower surface of the die with an electrically conductive shielding material, turning the die over so as to reverse the orientation of the upper and lower surfaces of the die.

* * * * *